United States Patent
Choi

(10) Patent No.: US 8,766,688 B2
(45) Date of Patent: Jul. 1, 2014

(54) DLL CIRCUIT AND DELAY-LOCKED METHOD USING THE SAME

(71) Applicant: SK hynix Inc., Icheon-si (KR)

(72) Inventor: Hoon Choi, Icheon-si (KR)

(73) Assignee: SK Hynix, Inc., Gyeonggi-do (KR)

( * ) Notice: Subject to any disclaimer, the term of this patent is extended or adjusted under 35 U.S.C. 154(b) by 0 days.

(21) Appl. No.: 13/710,748

(22) Filed: Dec. 11, 2012

(65) Prior Publication Data

US 2014/0062552 A1 Mar. 6, 2014

(30) Foreign Application Priority Data

Aug. 29, 2012 (KR) .................. 10-2012-0095228

(51) Int. Cl.
*H03L 7/08* (2006.01)
(52) U.S. Cl.
CPC ...................................... *H03L 7/08* (2013.01)
USPC .......................................... 327/158; 327/149
(58) Field of Classification Search
CPC ..... H03L 7/0814; H03L 7/0812; G11C 7/222
USPC ................................. 327/149, 158
See application file for complete search history.

(56) References Cited

U.S. PATENT DOCUMENTS

| | | | | |
|---|---|---|---|---|
| 6,597,753 B1 * | 7/2003 | Okayasu et al. | ............... | 375/373 |
| 7,046,060 B1 * | 5/2006 | Minzoni et al. | ............... | 327/158 |
| 7,724,051 B2 * | 5/2010 | Tomar et al. | .................. | 327/158 |
| 7,876,138 B2 * | 1/2011 | Kobayashi et al. | ........... | 327/158 |
| 8,164,370 B2 * | 4/2012 | Miyano | ......................... | 327/158 |
| 8,390,350 B2 * | 3/2013 | Na | ................................ | 327/158 |
| 2009/0189658 A1 * | 7/2009 | Tomar et al. | .................. | 327/158 |
| 2010/0201413 A1 * | 8/2010 | Miyano | ......................... | 327/158 |
| 2011/0102030 A1 * | 5/2011 | Goldman et al. | ............. | 327/156 |
| 2011/0234280 A1 * | 9/2011 | Na | ................................ | 327/158 |
| 2012/0038402 A1 * | 2/2012 | Takahashi | ..................... | 327/157 |
| 2012/0161829 A1 * | 6/2012 | Fernald | ......................... | 327/156 |
| 2012/0319747 A1 * | 12/2012 | Namdar-Mehdiabadi et al. | ............................. | 327/149 |
| 2012/0319748 A1 * | 12/2012 | Luo | ............................... | 327/158 |
| 2013/0121094 A1 * | 5/2013 | Zerbe et al. | .................... | 365/194 |

FOREIGN PATENT DOCUMENTS

KR 1020100064852 A 6/2010

* cited by examiner

*Primary Examiner* — Adam Houston
(74) *Attorney, Agent, or Firm* — William Park & Associates Patent Ltd.

(57) ABSTRACT

A delay-locked loop (DLL) circuit having improved phase correction performance includes a variable delay unit configured to generate a DLL clock signal by delaying an input clock signal by a varied delay time in response to a delay control signal at timing corresponding to an update cycle signal, a delay model configured to generate a feedback clock signal by delaying the DLL clock signal for a predetermined delay time, a phase detection unit configured to output a result of the detection of the phase of the feedback clock signal based on a reference clock signal as the delay control signal, and an update cycle control unit configured to determine whether a cycle has been shifted or not in response to an external clock signal and the delay control signal and shift a cycle where the update cycle signal is generated based on a result of the determination.

14 Claims, 3 Drawing Sheets

DLL CIRCUIT AND DELAY-LOCKED METHOD USING THE SAME

CROSS-REFERENCES TO RELATED APPLICATION

The present application claims priority under 35 U.S.C. §119(a) to Korean application number 10-2012-0095228, filed on Aug. 29, 2012, in the Korean Intellectual Property Office, which is incorporated herein by reference in its entirety.

BACKGROUND

1. Technical Field

The present invention generally relates to a semiconductor circuit, and more particularly, to a delay-locked loop (DLL) circuit and a delay-locked method using the same.

2. Related Art

A semiconductor device, such as semiconductor memory, operates in response to an external clock signal, that is, a clock signal supplied from a memory controller.

When an external clock signal is inputted to semiconductor memory, the external clock signal passes through a variety of internal circuits, such as an input buffer, a signal line, an output buffer, and a variety of logic circuits, and thus the phase of the external clock signal is shifted.

For this reason, the semiconductor memory can include a circuit for compensating for a shift in the phase of the external clock signal, that is, a DLL circuit.

The DLL circuit performs a phase correction operation so that the phase of the output signal of the semiconductor memory coincides with that of the external clock signal by compensating for the delay time of the external clock signal by the internal delay time of the semiconductor memory to which the DLL circuit is applied.

A conventional DLL circuit is designed to periodically perform the phase correction operation.

Here, the phase of the external clock signal can be shifted by the abnormal operation of an external system, that is, a memory controller, or a change in the operating environment of the semiconductor memory.

As described above, the conventional DLL circuit performs the phase correction operation in a predetermined cycle. If the phase of the external clock signal is shifted to a level in which the phase cannot be compensated for before a cycle where the phase correction operation is performed is reached, the conventional DLL circuit does not compensate for the shifted phase, leading to a phase correction fail.

SUMMARY

A DLL circuit having improved phase correction performance and a delay-locked method using the same are described herein.

In an embodiment, a DLL circuit includes a variable delay unit configured to generate a DLL clock signal by delaying an input clock signal by a varied delay time in response to a delay control signal at timing corresponding to an update cycle signal, a delay model configured to generate a feedback clock signal by delaying the DLL clock signal for a predetermined delay time, a phase detection unit configured to output a result of a detection of a phase of the feedback clock signal based on a reference clock signal as the delay control signal, and an update cycle control unit configured to determine whether a cycle has been shifted or not in response to an external clock signal and the delay control signal and shift a cycle where the update cycle signal is generated based on a result of the determination.

In an embodiment, a delay-locked method using a DLL circuit includes generating a feedback clock signal by varying a delay time of an input clock signal, detecting a phase of the feedback clock signal based on the input clock signal every update cycle, and adjusting the update cycle when the phase of the feedback clock signal is anterior or posterior to the input clock signal.

BRIEF DESCRIPTION OF THE DRAWINGS

Features, aspects, and embodiments are described in conjunction with the attached drawings, in which.

DETAILED DESCRIPTION

Hereinafter, a DLL circuit and a delay-locked method using the same according to the various embodiments will be described below with reference to the accompanying drawings through the embodiments.

Figure 1:
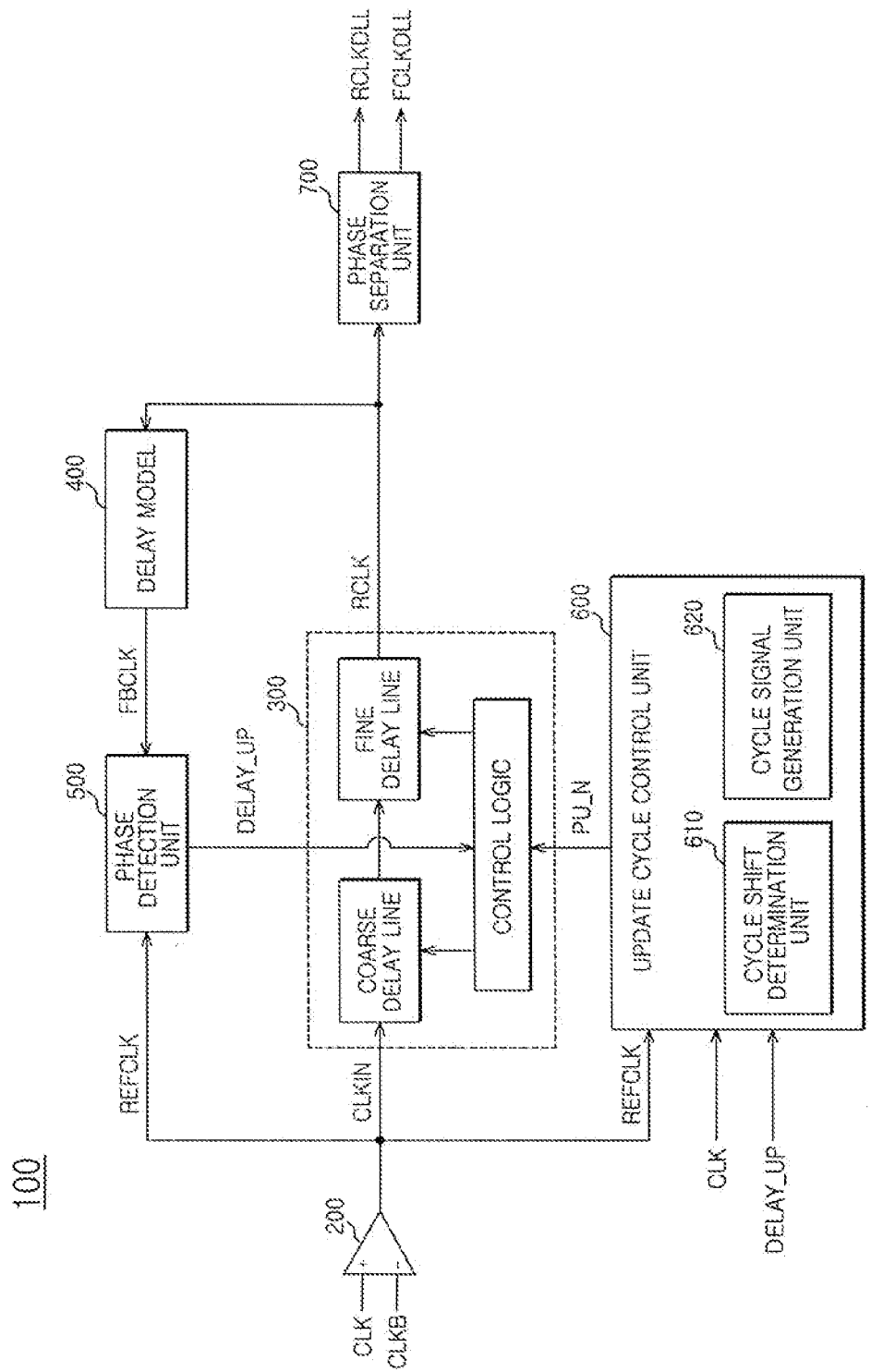
FIG. 1 is a block diagram of a DLL circuit 100 in accordance with an embodiment.

FIG. 1 is a block diagram of a DLL circuit 100 in accordance with an embodiment.

As shown in FIG. 1, the DLL circuit 100 in accordance with an embodiment may include a buffer 200, a variable delay unit 300, a delay model 400, a phase detection unit 500, an update cycle control unit 600, and a phase separation unit 700.

The buffer 200 may be configured to differentially buffer a pair of external clock signals CLK and CLKB and generate an input clock signal CLKIN and a reference clock signal REFCLK.

The input clock signal CLKIN and the reference clock signal REFCLK are assigned different names because they have different transmission paths, but can be seen as substantially the same signal.

The variable delay unit 300 may be configured to generate a DLL clock signal RCLK by delaying the input clock signal CLKIN by a varied delay time in response to a delay control signal DELAY_UP at timing corresponding to an update cycle signal PU_N.

The variable delay unit 300 can include a coarse delay line, a fine delay line, and a control logic circuit.

The delay model 400 may be configured to generate a feedback clock signal FBCLK by delaying the DLL clock signal RCLK for a predetermined delay time.

The delay times set in the delay model 400 may be obtained by modeling the internal signal processing delay time of a chip to which the DLL circuit has been applied.

The phase detection unit 500 may be configured to output a result of the detection of the phase of the feedback clock signal FBCLK based on the reference clock signal REFCLK as the delay control signal DELAY_UP.

The phase separation unit 700 may be configured to generate a pair of DLL clock signals RCLKDLL and FCLKDLL by separating the phase of the DLL clock signal RCLK.

The update cycle control unit 600 may be configured to generate the update cycle signal PU_N in response to the external clock signal CLK, the reference clock signal REFCLK, and the delay control signal DELAY_UP.

The update cycle control unit 600 may be configured to determine whether a cycle has been shifted or not in response to the external clock signal CLK and the delay control signal DELAY_UP and shift a cycle where the update cycle signal PU_N is generated based on a result of the determination.

The update cycle control unit 600 may include a cycle shift determination unit 610 and a cycle signal generation unit 620.

Figure 2:
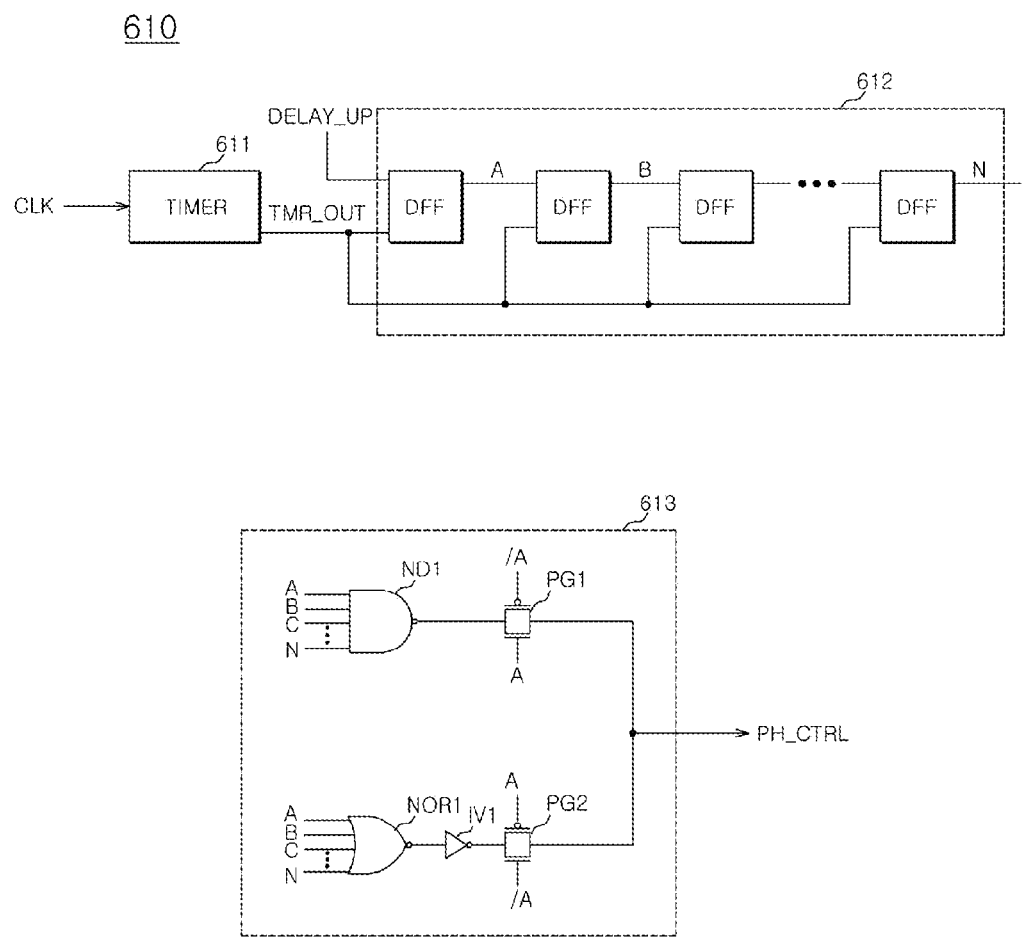
FIG. 2 is a circuit diagram of a cycle shift determination unit 610 of FIG. 1.

FIG. 2 is a circuit diagram of the cycle shift determination unit 610 of FIG. 1.

As shown in FIG. 2, the cycle shift determination unit 610 may be configured to determine whether a cycle has been shifted or not in response to the external clock signal CLK and the delay control signal DELAY_UP and generate a cycle shift determination signal PH_CTRL based on a result of the determination.

The cycle shift determination unit 610 may include a timer 611, a determination reference signal generation unit 612, and a determination unit 613.

The timer 611 may be configured to generate a timer signal TMR_OUT by dividing the external clock signal CLK by N.

The determination reference signal generation unit 612 may be configured to latch a plurality of determination reference signals A~N by latching the delay control signal DELAY_UP based on the timer signal TMR_OUT.

The determination reference signal generation unit 612 may include a plurality of flip-flops DFF configured to have the timer signal TMR_OUT received through a clock terminal and generate the plurality of determination reference signals A~N by latching the delay control signal DELAY_UP.

The determination unit 613 may be configured to output a result of a NOR operation or a result of an OR operation on the plurality of determination reference signals A~N as the cycle shift determination signal PH_CTRL in response to any one of the determination reference signals A~N, for example, the initial determination reference signal A, and an inverse signal A/thereof.

The determination unit 613 may include a first logic gate ND1, a second logic gate NOR1, an inverter IV1, a first pass gate PG1, and a second pass gate PG2.

The first logic gate ND1 and the first pass gate PG1 of the determination unit 613 are configured to output a result of a NOR operation on the plurality of determination reference signals A~N as the cycle shift determination signal PH_CTRL when the initial is determination reference signal A is enabled to a logic high level H (not shown).

The second logic gate NOR1, IV1 (i.e., inverter) and the second pass gate PG2 of the determination unit 613 may be configured to output a result of an OR operation on the plurality of determination reference signals A~N as the cycle shift determination signal PH_CTRL when the initial determination reference signal A is disabled to a logic low level L (not shown).

At this time, if the delay control signal DELAY_UP continues to have a value of a logic high level H or a logic low level L, the determination reference signal generation unit 612 outputs all the plurality of determination reference signals A~N as a logic high level or a logic low level.

What the delay control signal DELAY_UP continues to have a value of a logic high level or a logic low level means that the phase of the input clock signal CLKIN is greatly deviated from a value determined by a previous correction operation.

That is, this means that the phase of the feedback clock signal FBCLK is severely deviated from the reference clock signal REFCLK.

Thus, the first logic gate ND1 and the first pass gate PG1 of the determination unit 613 may output the cycle shift determination signal PH_CTRL as a logic low level when all the plurality of determination reference signals A~N has a value of a logic high level.

The second logic gate NOR1, the inverter IV1, and the second pass gate PG2 of the determination unit 613 may output the cycle shift determination signal PH_CTRL as a logic low level when all the plurality of determination reference signals A~N has a value of a logic low level.

Furthermore, the determination unit 613 may output the cycle shift determination signal PH_CTRL as a logic high level when all the plurality of determination reference signals A~N do not have a value of a logic high level or a logic low level.

Figure 3:
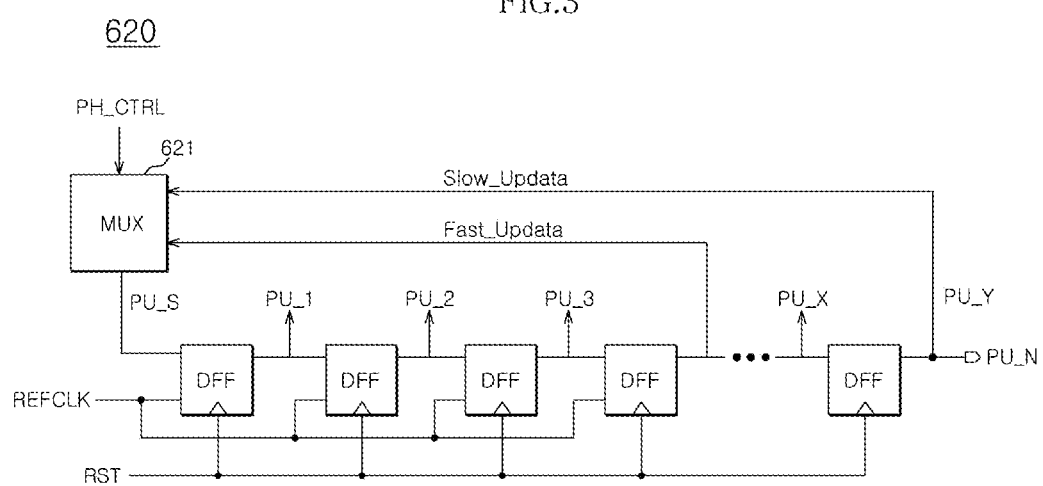
FIG. 3 is a circuit diagram of a cycle signal generation unit 620 of FIG. 1.

FIG. 3 is a circuit diagram of the cycle signal generation unit 620 of FIG. 1.

Referring to FIG. 3, the cycle signal generation unit 620 may be configured to shift a cycle in which the update cycle signal PU_N is generated by selecting one of a plurality of cycle reference signals PU_1~PU_Y, generated by latching an initial cycle reference signal PU_S in response to the reference clock signal REFCLK, as the initial cycle reference signal PU_S in response to the cycle shift determination signal PH_CTRL.

The cycle signal generation unit 620 may include a multiplexer MUX 621 and a plurality of flip-flops DFF.

The plurality of flip-flops DFF may be configured to generate the plurality of cycle reference signals PU_1~PU_Y by latching the initial cycle reference signal PU_S in response to the reference clock signal REFCLK.

The outputs of the plurality of flip-flops DFF are reset in response to a reset signal RST.

The multiplexer 621 may be configured to select a signal having an anterior or posterior timing, from the plurality of cycle reference signals PU_1~PU_Y, in response to the cycle shift determination signal PH_CTRL and provide the selected signal to the flip-flop DFF placed at the foremost stage as the initial cycle reference signal PU_S.

The multiplexer 621 can select the cycle reference signal PU_Y as the initial cycle reference signal PU_S when the cycle shift determination signal PH_CTRL has a level that defines low-speed update (for example, it can have the same level as the existing level), that is, a logic high level.

Additionally, the multiplexer 621 can select a signal having timing anterior to that of the cycle reference signal PU_Y, from the plurality of cycle reference signals PU_1~PU_Y, as the initial cycle reference signal PU_S when the cycle shift determination signal PH_CTRL has a level that defines high-speed update, that is, a logic low level.

When a signal having timing anterior to the cycle reference signal PU_Y, from among the plurality of cycle reference signals PU_1~PU_Y, is selected as the initial cycle reference signal PU_S, the cycle of the update cycle signal PU_N may be shortened.

As a result, the cycle signal generation unit 620 may generate the update cycle signal PU_N in a cycle shorter than a previous cycle when the cycle shift determination signal PH_CTRL has a level that defines high-speed update, that is, a logic low level, so that the phase correction operation of the DLL circuit 100 is performed at an earlier timing.

Additionally, when the cycle shift determination signal PH_CTRL has a level that defines low-speed update, that is, a logic high level, the cycle signal generation unit 620 may generate the update cycle signal PU_N in a cycle that is relatively longer than a cycle in high-speed update.

In accordance with an embodiment, a phase correction operation can be stably performed irrespective of a shift of the phase.

While various embodiments have been described above, it will be understood to those skilled in the art that the embodiments described are by way of example only. Accordingly, the DLL circuit and the delay-locked method described herein should not be limited based on the described embodiments.

What is claimed is:

1. A delay-locked loop (DLL) circuit, comprising:
a variable delay unit configured to generate a DLL clock signal by delaying an input clock signal by a varied delay time in response to a delay control signal at timings of generation of an update cycle signal;
a delay model configured to generate a feedback clock signal by delaying the DLL clock signal for a predetermined delay time;
a phase detection unit configured to output a result of a detection of a phase of the feedback clock signal based on a reference clock signal as the delay control signal; and
an update cycle control unit configured to shift a generation cycle of the update cycle signal by detecting the delay control signal to have a same logic level at a set number of times of generation of the update cycle signal in response to an external clock signal and the delay control signal.

2. The DLL circuit according to claim 1, further comprising a buffer configured to generate the input clock signal and the reference clock signal by buffering the external clock signal.

3. The DLL circuit according to claim 1, wherein the update cycle control unit comprises:
a cycle shift determination unit configured to determine whether a cycle has been shifted or not in response to the external clock signal and the delay control signal and generate a cycle shift determination signal based on a result of the determination, and
a cycle signal generation unit configured to shift the cycle where the update cycle signal is generated by selecting one of a plurality of cycle reference signals, generated by latching an initial cycle reference signal in response to the reference clock signal, as the initial cycle reference signal in response to the cycle shift determination signal.

4. The DLL circuit according to claim 3, wherein the cycle shift determination unit comprises:
a timer configured to generate a timer signal by dividing the external clock signal,
a determination reference signal generation unit configured to generate a plurality of determination reference signals by latching the delay control signal based on the timer signal, and
a determination unit configured to output a result of a first logic operation or a second logic operation on the plurality of determination reference signals as the cycle shift determination signal in response to any one of the plurality of determination reference signals.

5. The DLL circuit according to claim 4, wherein any one of the plurality of determination reference signals is enabled at an earliest timing.

6. The DLL circuit according to claim 4, wherein the determination reference signal generation unit comprises a plurality of flip-flops configured to have the timer signal received through a clock terminal and to generate the plurality of determination reference signals by latching the delay control signal.

7. The DLL circuit according to claim 4, wherein the determination unit comprises:
a first logic gate configured to perform a NOR operation on the plurality of determination reference signals,
a first pass gate configured to output an output of the first logic gate as the cycle shift determination signal when any one of the plurality of determination reference signals is enabled to a logic high level,
a second logic gate configured to perform an OR operation on the plurality of determination reference signals, and
a second pass gate configured to output an output of the second logic gate as the cycle shift determination signal when any one of the plurality of determination reference signals is disabled to a logic low level.

8. The DLL circuit according to claim 3, wherein the cycle signal generation unit comprises:
a plurality of flip-flops configured to generate the plurality of cycle reference signals by latching the initial cycle reference signal in response to the reference clock signal, and
a multiplexer configured to select signals having different timings from the plurality of cycle reference signals in response to the cycle shift determination signal and supply one of the selected signals to the plurality of flip-flops as the initial cycle reference signal.

9. The DLL circuit according to claim 8, wherein the multiplexer is configured to select a signal having an anterior timing from the signals of different timings when the cycle shift determination signal has a level that defines high-speed update.

10. The DLL circuit according to claim 1, further comprising a phase separation unit configured for generating a pair of DLL clock signals by separating the phase of the DLL clock signal.

11. The DLL circuit according to claim 1, wherein the variable delay unit comprises a coarse delay line and a fine delay line.

12. The DLL circuit according to claim 11, wherein the variable delay unit comprises a control logic circuit.

13. A delay-lacked method using a delay-locked loop (DLL) circuit, comprising:
generating a feedback clock signal by varying a delay time of an input clock signal in response to a delay control signal;
detecting a phase of the feedback clock signal based on the input clock signal every update cycle, and output a result of the detecting as the delay control signal; and
adjusting the update cycle by detecting the delay control signal to have a same logic level at a set number of times of the update cycle.

14. The delay-locked method according to claim 13, wherein the adjusting of the update cycle when the phase of the feedback clock signal is anterior to the input clock signal at a set number of times of the update cycle or posterior to the input clock signal at the set number of times of the update cycle comprises reducing the update cycle.

* * * * *